United States Patent [19]
Kwon et al.

[11] Patent Number: 5,406,110
[45] Date of Patent: Apr. 11, 1995

[54] RESURF LATERAL DOUBLE DIFFUSED INSULATED GATE FIELD EFFECT TRANSISTOR

[75] Inventors: Oh-Kyong Kwon, Plano; Taylor R. Efland, Richardson; Satwinder Malhi, Garland, all of Tex.; Wai T. Ng, Thornhill, Canada

[73] Assignee: Texas Instruments Incorporated, Dallas, Tex.

[21] Appl. No.: 191,228

[22] Filed: Feb. 1, 1994

Related U.S. Application Data

[62] Division of Ser. No. 815,732, Dec. 30, 1991, Pat. No. 5,306,652.

[51] Int. Cl.⁶ .................. H01L 27/092; H01L 27/105
[52] U.S. Cl. .................................. 257/493; 257/492; 257/335
[58] Field of Search ............... 257/335, 336, 337, 338, 257/339, 491, 492, 493

[56] References Cited

U.S. PATENT DOCUMENTS

| | | | |
|---|---|---|---|
| 4,922,327 | 5/1990 | Mena et al. | 257/336 |
| 5,237,193 | 8/1993 | Williams et al. | 257/336 |
| 5,304,827 | 4/1994 | Malhi et al. | 257/339 |

FOREIGN PATENT DOCUMENTS

| | | | |
|---|---|---|---|
| 2-30187 | 1/1990 | Japan | 257/335 |
| 2-198175 | 8/1990 | Japan | 257/339 |

*Primary Examiner*—Rolf Hille
*Assistant Examiner*—Wael M. Fahmy
*Attorney, Agent, or Firm*—Jacqueline J. Garner; Richard L. Donaldson; William E. Hiller

[57] ABSTRACT

A transistor (10) has a thin epitaxial layer (14) of a second conductivity type on a semiconductor substrate (12) of a first conductivity type. A drift region (24) of the second conductivity type is formed extending through the thin epitaxial layer (14) to the substrate (12). A thick insulator layer (26) is formed on the drift region (24). An IGFET body (28) of the first conductivity type is formed adjacent the drift region (24). A source region (34) of the second conductivity type is formed within the IGFET body (28) and spaced from the drift region (24) defining a channel region (40) within the IGFET body (28). A conductive gate (32) is insulatively disposed over the IGFET body (28) and extends from the source region (34) to the thick insulator layer (26). A drain region (36) is formed adjacent the drift region (24).

24 Claims, 1 Drawing Sheet

5,406,110

RESURF LATERAL DOUBLE DIFFUSED INSULATED GATE FIELD EFFECT TRANSISTOR

This is a division of application Ser. No. 07/815,732, filed Dec. 30, 1991, now U.S. Pat. No. 5,306,652.

TECHNICAL FIELD OF THE INVENTION

This invention relates in general to electronic power devices and more particularly to a lateral double diffused insulated gate field effect transistor and a process for its fabrication.

BACKGROUND OF THE INVENTION

Lateral double diffused insulated gate field effect transistors (sometimes known as LDMOS transistors) are the power devices of choice for integration in very large scale integrated circuit (VLSI) logic processes. The reduced surface field (RESURF) design technique provides better tradeoff between breakdown voltage and specific on-resistance ($r_{ds}$(on)) when compared to conventional LDMOS device designs. A RESURF n-channel LDMOS device will have an (N) drift region that surrounds an (N+) drain, given a (P−) semiconductor substrate. Relatively thick LOCOS oxide is grown on a portion of the drift region. A relatively deep (P) implant is used to make a body or (P) well of an insulated gate field effect transistor (IGFET) which spaces the drift region from an (N+) source region which is formed within the body. A (P+) back gate connection is also formed within the IGFET body implant region. A conductive gate is formed over and insulated from the IGFET body to extend from the source region over the body to the lateral margin of the LOCOS oxide and preferably extends onto a portion of this thicker oxide.

For a high voltage power device, the $r_{ds}$(on) should be relatively low. In order to obtain a low on-resistance, the dopant in the drift region must be of a relatively high concentration. However, an epitaxial layer with such a high concentration will make it very difficult to diffuse the IGFET body having a comparable doping concentration and will make it difficult to control the breakdown voltage of the RESURF IGFET. Furthermore, such a diffusion process would be incompatible with existing CMOS processes.

From the foregoing, it may be appreciated that a need has arisen to form a drift region with a high doping concentration and still be able to diffuse a comparably concentrated IGFET body in order to develop a RESURF LDMOS transistor having a low on-resistance and controllable breakdown voltage.

SUMMARY OF THE INVENTION

In accordance with the present invention, a reduced surface field lateral double diffused insulated gate field effect transistor (RESURF LDMOST) and fabrication process are provided which substantially eliminate or reduce disadvantages and problems associated with prior transistors of this type.

The present invention includes a process for fabricating a RESURF LDMOS transistor. The process includes placing a lightly doped thin (N−) epitaxial layer on a (P−) substrate. An (N) drift region is formed in defined areas of the epitaxial layer through use of masking techniques. A thick insulator layer is formed on the drift region. A (P) IGFET body is formed adjacent the drift region and spaces an (N+) source region subsequently formed within the body from the drift region. This spacing creates a channel region within the IGFET body. An (N+) drain region is formed adjacent the drift region and spaced from the IGFET body. A conductive gate is insulatively disposed over the IGFET body and extends from the source region to the thick insulator layer.

The present invention provides technical advantages over transistors and fabrication processes included within the prior art. One technical advantage is the ability to diffuse the IGFET body and still have a drift region with a high doping concentration. Another technical advantage is the ability to vary the breakdown voltage rating of the output devices by simply adjusting the implant dose. Another technical advantage is the ability to fabricate multiple transistors with different breakdown voltage ratings on the same chip through proper masking of different drift region implants. Yet another technical advantage is the reduction in the on-resistance over conventional transistors while maintaining the same breakdown voltage rating. Still another technical advantage is to provide a current path between the drift region and the channel region necessary to avoid increasing the on-resistance of the device.

BRIEF DESCRIPTION OF THE DRAWINGS

For a more complete understanding of the present invention and the advantages thereof, reference is now made to the following description taken in conjunction with the accompanying drawings wherein like parts are identified with like reference numerals and in which.

DETAILED DESCRIPTION OF THE INVENTION

Figure 1:
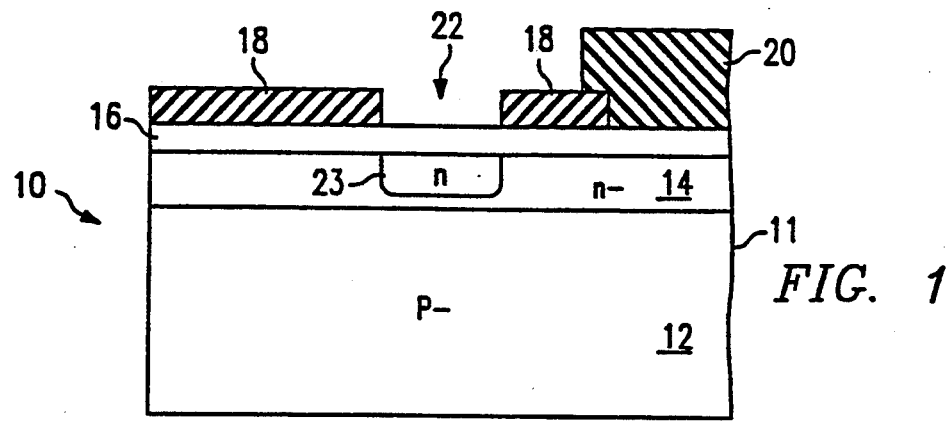
FIGS. 1 through 4 are highly magnified schematic sectional views of a RESURF LDMOS transistor showing successive stages in its fabrication process.

Referring to FIG. 1, there is illustrated a sectional view of a RESURF LDMOS transistor 10 in the initial stages of the fabrication process. Though not shown, a similar transistor is usually fabricated adjacent edge 11. Transistor 10 is comprised of a relatively lightly doped (P−) semiconductor substrate 12. A thin, lightly doped (N−) epitaxial layer 14 is grown on substrate 12. Epitaxial layer 14 has a preferred thickness in the approximate range of 10,000 Angstroms to 20,000 Angstroms. Though epitaxial layer 14 is described as grown on substrate 12, epitaxial layer 14 may be implanted within substrate 12. A sacrificial oxide layer 16 is then grown on epitaxial layer 14. Oxide layer 16 has a preferred thickness in the approximate range of 400 Angstroms to 500 Angstroms. A nitride layer mask 18 is deposited on oxide layer 16 and is subsequently patterned and etched away to expose an implant area 22. Nitride layer mask 18 has a preferred thickness of approximately 1400 Angstroms. A second mask 20 of photoresist material may also be used to block the implant in areas where a drift region formation is not desired. An (N) dopant 23 is implanted into implant area 22 and has a higher dopant concentration than epitaxial layer 14. In the preferred embodiment, arsenic is used with an implantation energy of approximately 150 KeV and a dose in the approximate range of $1 \times 10^{12}$ atoms/cm$^2$ to $5 \times 10^{12}$ atoms/cm$^2$.

Figure 2:
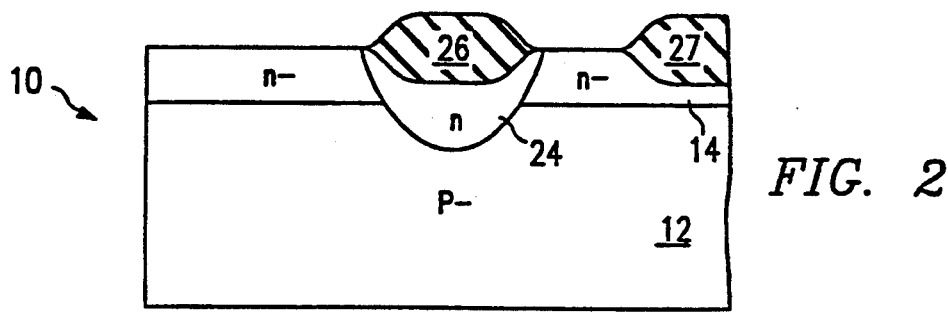

Referring next to FIG. 2, photoresist mask 20 is stripped away after implantation. A thick insulator layer 26 of LOCOS oxide is grown under a steam atmosphere preferably at approximately 900° C. for approximately 350 minutes, to a preferred thickness in the approximate range of 6800 Angstroms to 8300 Angstroms on drift region 24. LOCOS oxidation is performed using the existing nitride mask so that drift region 24 is self aligned to thick insulator layer 26. The (N) dopant 23 is driven in to produce an (N) drift region 24 which extends through epitaxial layer 14 to (P−) substrate 12. The diffusion drive-in preferably takes place at approximately 1100° C. for approximately 120–240 minutes. Oxide region 27 defines an isolation region between adjacent transistors. Nitride layer mask 18 and oxide layer 16 are stripped away.

Figure 3:
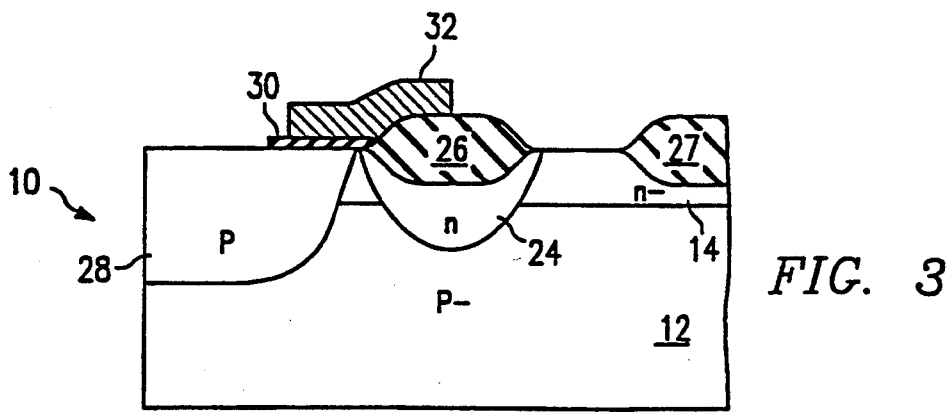

Referring next to FIG. 3, a third mask (not shown) is used to define an implant area for an IGFET body 28. IGFET body 28 consists of a region implanted with a (P) dopant. In the preferred embodiment, boron is used with an implantation energy of approximately 40 KeV and a dose in the approximate range of $1.7 \times 10^{13}$ atoms/cm$^2$ to $3 \times 10^{13}$ atoms/cm$^2$. The implant is then driven in to form IGFET body 28. The diffusion drive-in preferably takes place at approximately 1100° C. for approximately 500–700 minutes. The third mask is then stripped away.

A thin gate insulator 30 is grown over the entire surface of transistor 10. Thin gate insulator 30 has a preferred thickness in the approximate range of 200 Angstroms to 500 Angstroms. Etching occurs so that thin gate insulator 30 extends on IGFET body 28 to thick insulator layer 26. A conductive gate 32 is then formed over the entire surface of transistor 10. Conductive gate 32 has a preferred thickness in the approximate range of 3000 Angstroms to 5000 Angstroms and comprises polycrystalline silicon. Conductive gate 32 is preferably doped with POCl$_3$ having a concentration of approximately $1 \times 10^{21}$ atoms/cm$^3$. Conductive gate 32 is then etched away to extend over IGFET body 28 on thin gate insulator 30 and onto thick insulator layer 26. Thin gate insulator 30 insures that conductive gate 32 is spaced from IGFET body 28.

Figure 4:
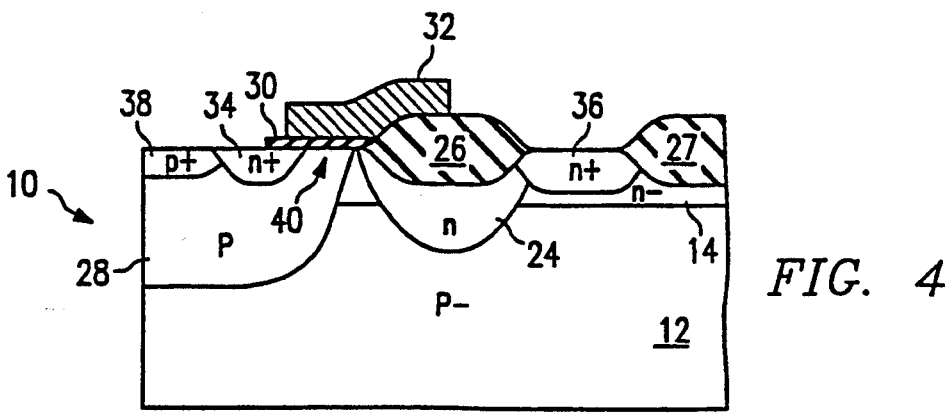

The remaining important steps in the fabrication process are illustrated in FIG. 4. A fourth masking step (not shown) defines an implant area for a source region 34 within IGFET body 28. The implant of drain region 36 is aligned to margins of thick oxide regions 26 and 27. These regions are implanted with a highly concentrated (N) dopant. In the preferred embodiment, arsenic is used with an implantation energy of approximately 180 KeV and a dose in the approximate range of $4 \times 10^{15}$ atoms/cm$^2$ to $5 \times 10^{15}$ atoms/cm$^2$. The fourth mask is then stripped away. Formation of source region 34 and drain region 36 may be performed in independent steps if different dopant concentrations for each region are desired. A fifth masking step (not shown) defines an implant area within IGFET body 28 to form a back gate connection region 38. Back gate connection region 38 is implanted with a highly concentrated (P) dopant. In the preferred embodiment, boron is used with an implantation energy of approximately 180 KeV and a dose in the approximate range of $2 \times 10^{15}$ atoms/cm$^2$ to $3 \times 10^{15}$ atoms/cm$^2$. The implants are then driven in to form source region 34, drain region 36, and back gate connection region 38. The diffusion drive-in preferably takes place at approximately 900° C. for approximately 90 minutes. The formation of source region 34 defines a channel region 40 within IGFET body 28 between source region 34 and drift region 24. The dopant concentration of channel region 40 may be increased by performing a separate implantation process in IGFET body 28 to further enhance characteristics and performance of device 10. Conductive gate 32 controls the conductance within channel region 40. Metal contacts (not shown) are then made to back gate connection region 38, source region 34, conductive gate 32, and drain region 36 by steps well known in the art to provide the finished transistor.

By using a thin epitaxial layer 14, drift region 24 can extend into substrate 12 and IGFET body 28 can easily be diffused through thin epitaxial layer 14 without adversely affecting drift region 24. The breakdown voltage rating of transistor 10 will be determined by the implant dose of drift region 24 due to the higher dopant concentration in drift region 24 than in thin epitaxial layer 14. Different transistors 10 can be fabricated with different breakdown voltage ratings by altering the implant dose of drift region 24. Also, through proper masking and by varying the implant doses, multiple transistors can be fabricated on substrate 12 each having different breakdown voltage ratings. Device 10 provides for breakdown to occur beneath drain region 36 instead of at the surface as with other lateral devices.

Another aspect of this self aligned drift region implant process is the reduction in on-resistance ($r_{ds}$(on)) of transistor 10 while maintaining the same breakdown voltage as compared to prior art transistors. The amount of on-resistance is inversely proportional to the dopant concentration of drift region 24. By being able to place a highly concentrated dopant in the RESURF drift region 24 while not affecting the diffusion of IGFET body 28, a reduction of approximately 40% in the $r_{ds}$(on) value is achieved over prior art transistors. Improved on-resistance of device 10 can also be achieved by increasing the dopant concentration in channel region 40. Additionally, epitaxial layer 14 provides a continuous path for current flow between drift region 24 and channel region 40. Without epitaxial layer 14 current would flow through drift region 24 only. As a result, current crowding may occur at the margin of thick insulator layer 26 producing a high on-resistance. Epitaxial layer 14 ensures that this current crowding does not occur to affect the on-resistance of device 10. Improved on-resistance occurs at lower gate voltages eliminating the need for a charge pump to increase gate voltage to offset the on-resistance of the device.

In summary, a RESURF LDMOS transistor and fabrication process with reduced on-resistance and adjustable breakdown voltage characteristics has been shown and described. Although the preferred embodiment has been described in detail, it should be understood that various changes, substitutions, and alterations can be made therein. For example, the above description relates to an n-channel RESURF LDMOST. The invention can also be applied to a p-channel device by changing the doping type. Other examples are readily ascertainable by one skilled in the art and could be made without departing from the spirit and scope of the invention as defined by the following claims.

What is claimed is:

1. A transistor formed on a semiconductor layer of a first conductivity type comprising:
    a thin epitaxial layer of a second conductivity type opposite said first conductivity type and formed on the semiconductor layer;
    a drift region of said second conductivity tape formed at a face of said thin epitaxial layer;

a thick insulator layer formed on said drift region, wherein said drift region is self-aligned to margins of said thick insulator layer;

a body of the first conductivity type formed at said face of said thin epitaxial layer adjacent said drift region;

a source region of said second conductivity type formed at said face of said thin epitaxial layer laterally within said body, said body having a channel region between said source region and said drift region;

a conductive gate insulatively disposed over said body and extending between said source region and said thick insulator layer to control conductance of said channel region; and a drain region of said second conductivity type formed at said face of said thin epitaxial layer adjacent said drift region.

2. The transistor of claim 1 wherein said conductive gate extends onto at least a portion of said thick insulator layer.

3. The transistor of claim 1 and further comprising a back gate connection region of the first conductivity type formed within said body.

4. The transistor of claim 3 wherein said back gate connection region adjoins said source region.

5. The transistor of claim 3 wherein a dopant concentration of said back gate connection region is higher than that of said body.

6. The transistor of claim 1 wherein a dopant concentration of said drift region is higher than that of said thin epitaxial layer.

7. The transistor of claim 1 wherein a dopant concentration of said drain region is higher than that of said drift region.

8. The transistor of claim 1 wherein a dopant concentration of said body is higher than that of the semiconductor layer.

9. The transistor of claim 1 wherein said source region and said drain region have the same dopant concentration.

10. The transistor of claim 1 wherein said drift region extends through said thin epitaxial layer to the semiconductor layer.

11. The transistor of claim 1 wherein said body extends through said thin epitaxial layer to the semiconductor layer.

12. The transistor of claim 1 wherein the first conductivity type is a (P) type.

13. The transistor of claim 1 wherein said thin epitaxial layer provides a continuous path for current flow between said drift region and said channel region.

14. The transistor of claim 1 wherein a desired breakdown voltage is selected in response to variations in dopant concentrations of said drift region and said body.

15. The transistor of claim 1 wherein a desired on-resistance is selected in response to variations in dopant concentrations of said drift region and said body.

16. The transistor of claim 1 wherein said channel region is implanted with a higher dopant concentration than said body.

17. The transistor of claim 1 wherein breakdown occurs beneath said drain region.

18. A reduced surface field lateral double diffused insulated gate field effect transistor formed on a semiconductor layer of a first conductivity type comprising:

a thin epitaxial layer of a second conductivity type opposite said first conductivity type and formed on the semiconductor layer;

a drift region of said second conductivity type formed at a face of said thin epitaxial layer extending through said thin epitaxial layer to the semiconductor layer and having a higher dopant concentration than said thin epitaxial layer;

a thick insulator layer formed on said drift region;

a body of the first conductivity type formed adjacent said drift region at said face of said thin epitaxial layer extending through said thin epitaxial layer to the semiconductor layer and having a higher dopant concentration than the semiconductor layer;

a source region of said second conductivity type formed laterally within said body at said face of said thin epitaxial layer defining a channel region within said body between said source region and said drift region;

a conductive gate insulatively disposed over said body extending between said source region and said thick insulator layer to control conductance of said channel region; and a drain region of said second conductivity type formed at said face of said thin epitaxial layer adjacent said drift region and having a higher dopant concentration than said drift region.

19. The transistor of claim 18 and further comprising a back gate connection region within said body adjacent said source region and having a higher dopant concentration than said body.

20. The transistor of claim 18 wherein said thin epitaxial layer provides a continuous path for current flow between said drift region and said channel region.

21. The transistor of claim 18 wherein a desired breakdown voltage is selected in response to variations in dopant concentrations of said drift region and said body.

22. The transistor of claim 18 wherein a desired on-resistance is selected in response to variations in dopant concentrations of said drift region and said body.

23. The transistor of claim 18 wherein said channel region has a higher dopant concentration than said body.

24. The transistor of claim 18 wherein breakdown occurs beneath said drain region.

* * * * *